(12) United States Patent
Sugatani et al.

(10) Patent No.: US 6,991,996 B2
(45) Date of Patent: Jan. 31, 2006

(54) MANUFACTURING METHOD OF SEMICONDUCTOR DEVICE AND SEMICONDUCTOR CHIP USING SOI SUBSTRATE, FACILITATING CLEAVING

(75) Inventors: Shinji Sugatani, Kawasaki (JP); Satoshi Sekino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/634,839

(22) Filed: Aug. 6, 2003

(65) Prior Publication Data

US 2004/0026799 A1    Feb. 12, 2004

Related U.S. Application Data

(62) Division of application No. 10/289,295, filed on Nov. 7, 2002, now Pat. No. 6,639,280.

(30) Foreign Application Priority Data

Jan. 17, 2002   (JP)   ............................. 2002-008742

(51) Int. Cl.
  *H01L 21/301*   (2006.01)
  *H01L 21/46*    (2006.01)
  *H01L 21/78*    (2006.01)
(52) U.S. Cl. ..................... 438/462; 438/479; 438/517
(58) Field of Classification Search ............... 438/479, 438/462, 517
  See application file for complete search history.

(56) References Cited

U.S. PATENT DOCUMENTS 3,054,709 A * 9/1962 Freestone et al. ........... 438/460
3,542,266 A * 11/1970 Woelfle ........................ 225/2
3,816,906 A * 6/1974 Falckenberg ................ 438/460
6,596,185 B2 * 7/2003 Lin et al. ...................... 216/24
6,797,539 B2 * 9/2004 Wada et al. ................. 438/110

FOREIGN PATENT DOCUMENTS

JP    9-246505    9/1997

OTHER PUBLICATIONS

H. Sayama et al.; "Effect of <100> Channel Direction for High Performance SCE Immune pMOSFET with Less Than 0.15 $\mu$m Gate Length", 1999 International Electron Devices Meeting, Washington, D.C., Dec. 5-8, 1999/Discussed in the specification.

Chinese Office Action dated Oct. 29, 2004 with partial English-translation.

* cited by examiner

*Primary Examiner*—Howard Weiss
(74) *Attorney, Agent, or Firm*—Armstrong, Kratz, Quintos, Hanson & Brooks, LLP

(57) ABSTRACT

A laminated substrate is formed by laminating a device formation layer made of single crystalline semiconductor on a supporting substrate made of single crystalline semiconductor via an insulating layer with making one direction of a crystallographic axis of the device formation layer be shifted from a corresponding direction of a crystallographic axis of the supporting substrate. Semiconductor devices are formed in the device formation layer within a plurality of areas divided by scribe lines extending to a direction being parallel to a direction of a crystallographic axis where the supporting substrate is easy to be cleaved. The laminated substrate is split into a plurality of chips by cleaving the supporting substrate along the scribe lines. A semiconductor device can easily be split into chips even if a moving direction of carrier and an extending direction of wiring are shifted from an easy-cleaved direction of a crystallographic axis.

5 Claims, 4 Drawing Sheets

MANUFACTURING METHOD OF SEMICONDUCTOR DEVICE AND SEMICONDUCTOR CHIP USING SOI SUBSTRATE, FACILITATING CLEAVING

CROSS REFERENCE TO RELATED APPLICATION

This application is a divisional of U.S. Ser. No. 10/289,295 filed Nov. 7, 2002, now U.S. Pat. No. 6,639,280, which is based on Japanese Patent Application 2002-008742, filed on Jan. 17, 2002, the entire contents of which are incorporated herein by reference.

BACKGROUND OF THE INVENTION

A) Field of the Invention

This invention relates to a manufacturing method of a semiconductor device and a semiconductor chip, more specifically, a semiconductor device and a semiconductor chip using a semiconductor on insulator (SOI) substrate and being capable of improving device property.

B) Description of the Related Art

A technique for improving carrier mobility and controlling short-channel effect by parallelizing a moving direction of carrier of a p-channel MOSFET to a <100> direction of single crystal silicon is reported (IEDM1999, 27-5, Effect of <100> Direction for High Performance SCE Immune pMOSFET with Less Than 0.15 mm Gate Length).

Also, research and development of a technique for applying an SOI substrate to a semiconductor integrated circuit device have been carried out for more than 20 years. Conventionally, the SOI substrate has been limited to be used in a semiconductor device for a special purpose such as high withstand voltage. Since International Business Machines Corporation adapted the SOI substrate to a microprocessor unit (MPU) in 1998, cases of adapting the SOI substrate to the semiconductor integrated circuit has been increased. When the SOI substrate is used, comprising to that of using a normal semiconductor substrate, it is possible to increase an operating speed of a semiconductor device and lower amounts of electric power consumption.

Conventionally, in a semiconductor integrated circuit device using a silicon substrate, a gate electrode and wirings of the MOSFET were configured to be parallel to a <110> direction of the silicon substrate. Scribe lines were also configured to be parallel to the <110> direction; therefore, the substrate could be easily split into chips by cleaving the substrate. Also, since a cleaving direction and a direction to which the gate electrode and the wirings could be observed by cleaving and defection analysis etc. could be performed.

However, when the MOSFET is configured to have the moving direction of the carrier be parallel to the <100> direction in order to increase the mobility of the extending direction of the gate electrode and the <110> direction cross at 45-degree angle. For this reason, it is difficult to apart into chips by cleaving. Further, it is difficult to observe the cross section of the gate electrode and the wiring.

SUMMARY OF THE INVENTION

It is an object of the present invention to provide a manufacturing method of a semiconductor device that can easily be split into chips even if a moving direction of carrier and a direction to which a wiring extends are shifted from a direction of a crystallographic axis that can be easily cleaved.

It is another object of the present invention to provide a semiconductor chip that is appropriate for applying the above manufacturing method.

According to one aspect of the present invention, there is provided a method for manufacturing a semiconductor device, comprising the steps of: (a) forming a laminated substrate by laminating a device formation layer consisting of single crystalline semiconductor on a supporting substrate consisting of single crystalline semiconductor via an insulating layer wherein a direction of a crystallographic axis of the device formation layer is shifted from a corresponding crystallographic axis of the supporting substrate; (b) forming semiconductor devices on the device formation layer within a plurality of areas divided by scribe lines extending to a direction being parallel to a direction of a crystallographic axis where the supporting substrate is easy to be cleaved; and (c) splitting the laminated substrate into a plurality of chips by cleaving the supporting substrate along the scribe lines.

According to another aspect of the present invention, there is provided a semiconductor chip, comprising: a SOI substrate wherein a supporting substrate consisting of single crystalline semiconductor, an insulating layer and a device formation layer consisting of single crystalline semiconductor are laminated sequentially, and one direction of a crystallographic axis of the device formation layer is shifted from a corresponding direction of a crystallographic axis of the supporting substrate, comprising an end surface parallel to a direction of a crystallographic axis where the supporting substrate is easy to be cleaved; and a semiconductor device formed in the device formation layer.

The laminated substrate can be split into a plurality of chips by cleaving the support substrate because the scribe lines are parallel to the crystallographic axis where the supporting substrate is easy to be cleaved. The crystallographic axis of the device formation layer is out of alignment relative to those of the support substrate. For example, the crystallographic axis can be aligned so as to improve the property of the semiconductor device on the device formation layer.

According to further another aspect of the present invention, there is provided a semiconductor chip, comprising: a SOI substrate wherein a supporting substrate consisting of single crystalline semiconductor, an insulating layer and a device formation layer consisting of single crystalline semiconductor are laminated sequentially, and one direction of a crystallographic axis of the device formation layer is shifted from a corresponding direction of a crystallographic axis of the supporting substrate, comprising an end surface parallel to a direction of a crystallographic axis where the supporting substrate is easy to be cleaved; and an active device formed in the device formation layer, a moving direction of carrier of active device being the <100> direction of the device formation layer.

The carrier mobility can be increased by making the moving direction of carriers parallel to <100> direction.

According to yet further another aspect of the present invention, there is provided a semiconductor chip, comprising: a SOI substrate wherein a supporting substrate consisting of single crystalline semiconductor, an insulating layer and a device formation layer consisting of single crystalline semiconductor are laminated sequentially, and one direction of a crystallographic axis of the device formation layer is shifted from a corresponding direction of a crystallographic axis of the supporting substrate, comprising an end surface parallel to a direction of a crystallographic axis where the supporting substrate is easy to be cleaved; a semiconductor device formed in the device formation layer; and a wiring layer comprising a plurality of wirings substantially extending to one direction wherein the plurality of wirings in the wiring layer and the direction of a crystallographic axis where the supporting substrate is easy to be cleaved are configured to be substantially parallel.

The section of the wiring can be observed and analyzed by cleaving the support substrate.

As described above, the directions of the crystallographic axis of the supporting substrate and the device formation layer are shifted each other. The direction of the crystallographic axis of the device formation layer is appropriated to improve the property of the semiconductor device, and the direction of the crystallographic axis of the supporting substrate is appropriated to easily be split into chips by cleaving.

DETAILED DESCRIPTION OF THE PREFERRED EMBODIMENTS

A manufacturing method of a semiconductor device according to the embodiment of the present invention is explained with reference to FIG. 1A to FIG. 4.

Figure 1A:
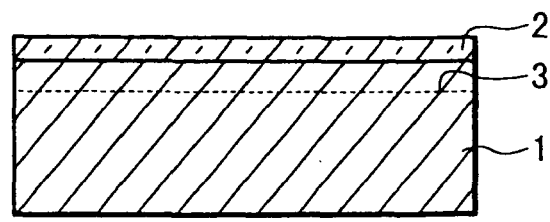
FIGS. 1A, 1B and 1D are cross sectional views for explaining a method of manufacturing a laminated substrate used for a semiconductor device according to an embodiment of the present invention.

FIG. 1A shows a cross sectional view of a substrate to be a device formation layer for forming a semiconductor device. A silicon oxide film 2 is formed on a surface of a substrate 1 formed of single crystal silicon. Miller index on the surface of the silicon substrate 1 is [100]. The silicon oxide film 2, for example, is formed using chemical vapor deposition (CVD) or the like, and whose thickness is about 0.2 $\mu$m. A film which is made of insulating material other than the silicon oxide may be formed instead of the silicon oxide film 2.

A hydrogen doped layer 3 is formed at, for example, a deepness of 1 to 2 $\mu$m from a surface where the silicon oxide film 2 is formed. The hydrogen doped layer 3 is formed by doping, for example, hydrogen ion under a condition that an amount of doping is 3.5 to $10 \times 10^{16}$ cm$^{-2}$ through the silicon oxide film 2. Acceleration energy is selected by the thickness of the silicon oxide 2 or the deepness of the hydrogen doped layer 3.

Figure 1B:
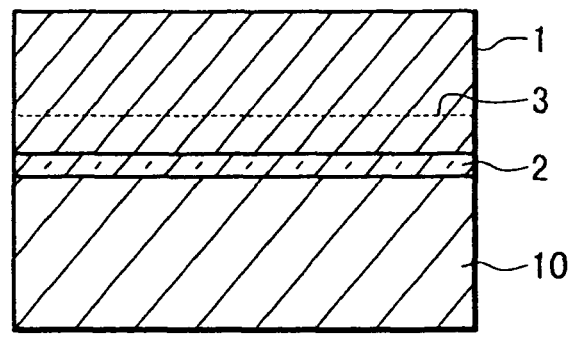

As shown in FIG. 1B, the silicon substrate 1 is laminated so as to stick to the supporting substrate 10 that is made of a single crystal silicon 10 in order to stick the surface of the silicon oxide film 2 to the supporting substrate 10. The thickness of the supporting substrate 10, for example, is 600 $\mu$m and Miller index of the surface of the supporting substrate 10 is [100].

Figure 1C:
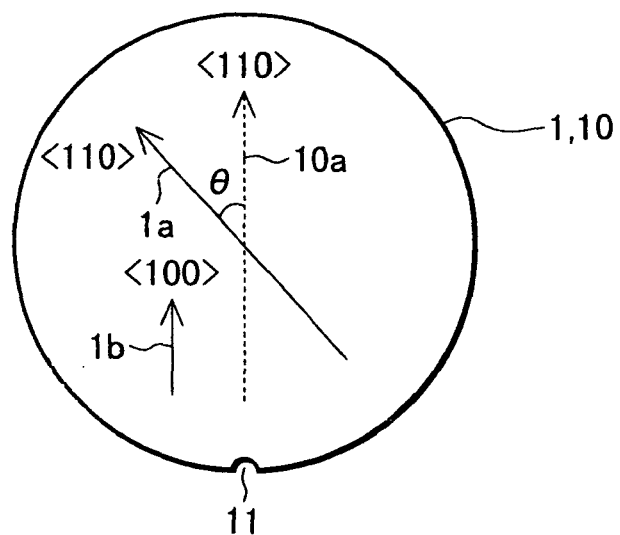
FIG. 1C is a plan view showing the direction of the crystallographic axis of the laminated substrate.

FIG. 1C shows a plan view of the laminated substrate. A notch 11 is formed at the edge of the supporting substrate for representing a <110> direction 10a of the supporting substrate 10. And an orientation flat may be formed instead of the notch. A <110> direction 1a of the silicon substrate that becomes to be the device formation layer shifts only θ degree from the <110> direction 10a of the supporting substrate 10. In the embodiment of the present invention, the direction of the supporting substrate 10 and the silicon substrate 1 are adjusted in order to the shifted angle is 45 degree. The <100> direction 1b of the silicon substrate 1 is at an angle of 45 degree with the <110> direction 1a; therefore, it will be parallel to the <110> direction 10a of the supporting substrate 10.

A thermal process at a temperature of 500 degree centigrade is performed as it is laminated.

Figure 1D:
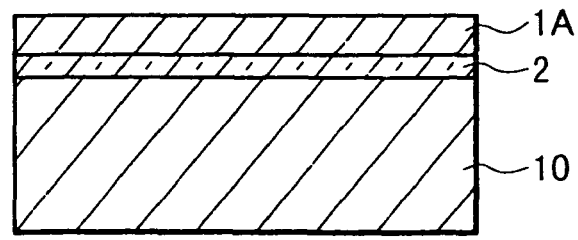

As shown in FIG. 1D, an exfoliation at a position of the hydrogen doped layer 3 is resulted by the thermal process, and a thin device formation layer 1A which is made of a part of the silicon substrate 1 is remained on the surface of the supporting substrate 10. The silicon oxide film 2 is remained between the device formation layer 1A and the supporting substrate 10. The surface of the device formation layer 1A is performed chemical mechanical polishing, the surface layer in which hydrogen remains is removed, and the surface is planalized. Thereafter, the thermal process at a temperature of 1100 degree centigrade is performed to improve bonding for 2 hours.

Figure 2:
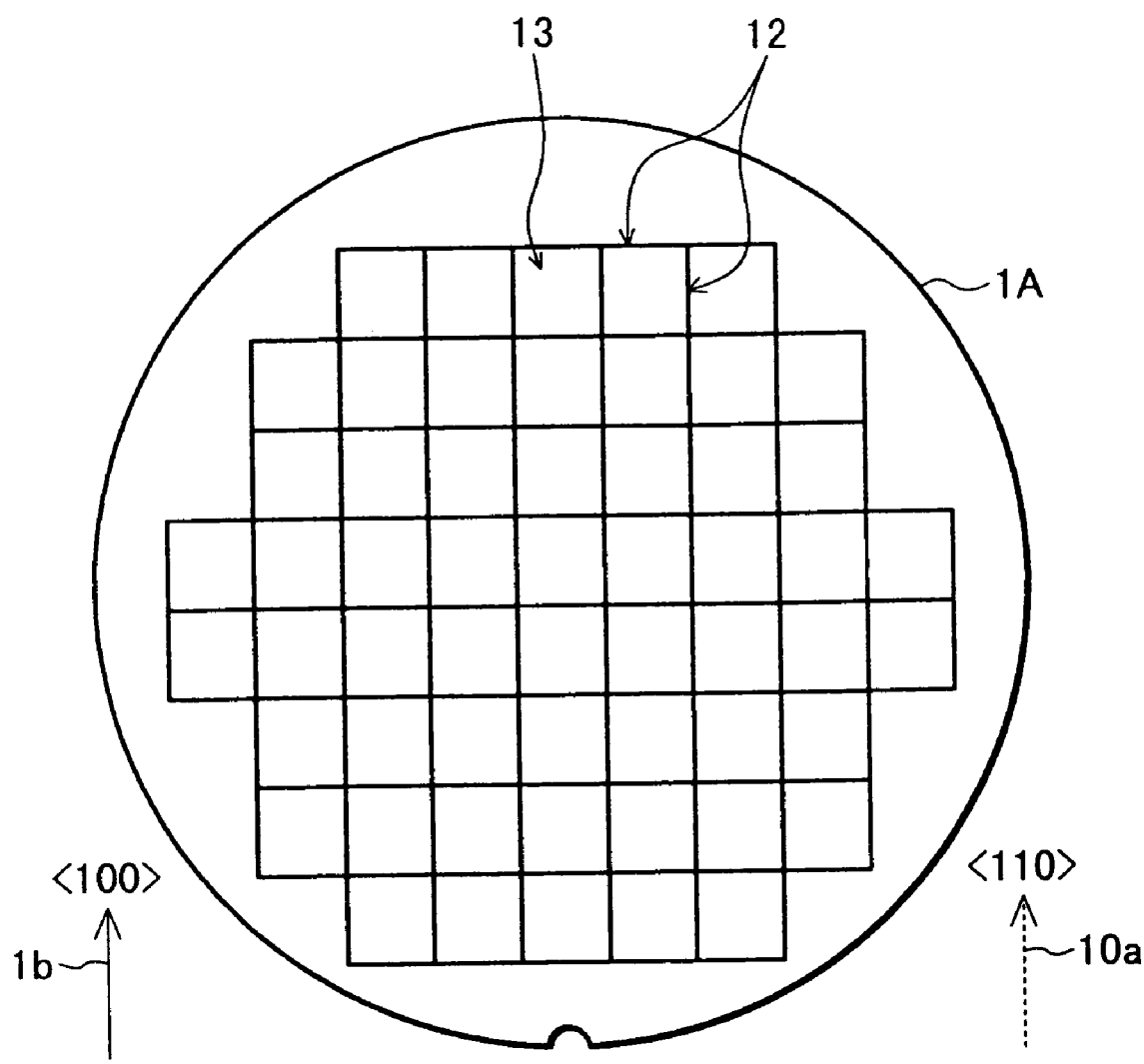
FIG. 2 is a plan view showing the laminated substrate used for the semiconductor device according to the embodiment of the present invention.

FIG. 2 shows a plan view of the device formation layer 1A. A vertical direction of FIG. 2 is parallel to the <110> direction 10a of the supporting substrate 10. Plurality of chip areas 13 are defined by latticed scribe lines 12. Each of the scribe lines 12 is extended to a vertical direction or a horizontal direction. The semiconductor device and the wiring are formed in the chip areas 13 by using techniques such as a well-known photolithography, film formation, an etching and an ion implantation.

The scribe lines extending longitudinal direction of FIG. 2 are parallel to the <110> direction 10a of the supporting substrate 10. The crystallographic axis indicated by <110> includes all of the crystalline axes equivalent to <110>. That is, a direction crossing with the <110> direction 10a showed in FIG. 2 at a right angle is also indicated by <110>. Therefore, the scribe lines extending vertical direction of FIG. 2 are also parallel to the <110> direction.

Figure 3A:
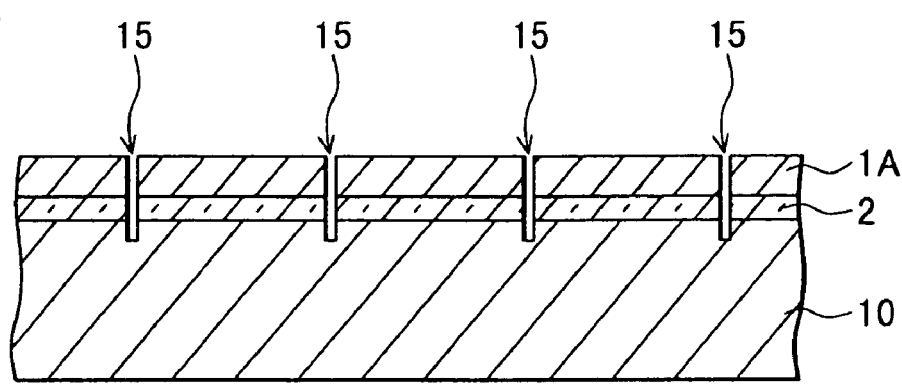
FIGS. 3A and 3B are cross sectional views showing the laminated substrate used for the semiconductor device according to the embodiment of the present invention.

As shown in FIG. 3A, a groove 15 reaching from the device formation layer 1A to the supporting substrate 10 is formed. The groove 15 is formed along the scribe lines 12 shown in FIG. 2.

Figure 3B:
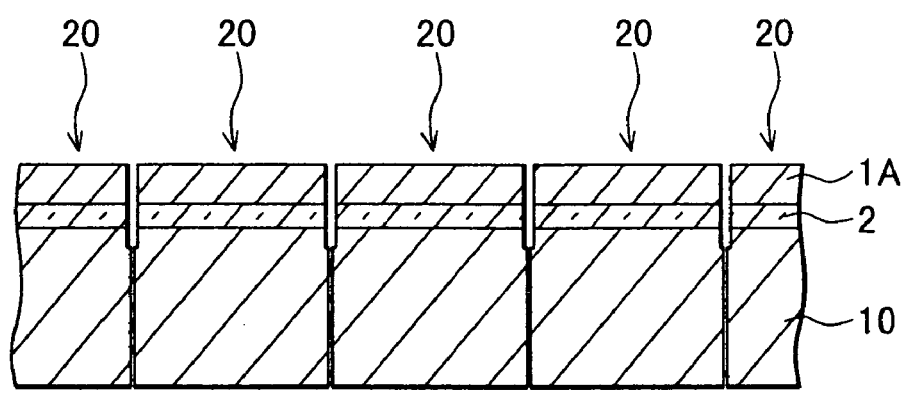

As shown in FIG. 3B, the supporting substrate 10 is cleaved at the groove 15. By doing that, the supporting substrate 10 can be split into a plurality of chips 20. Since the <110> direction of the single crystal silicon is easy to cleave, the supporting substrate 10 can be easily cleaved.

Further, the groove 15 may have a depth reaching the bottom of the device formation layer 1A. In this case, when the supporting substrate 10 is cleaved, the silicon oxide film is cut along the cleaved surface. Also, when the device formation layer 1A is thin enough, it can be cleaved along the <110> direction of the supporting substrate without forming the groove 15.

Figure 4:
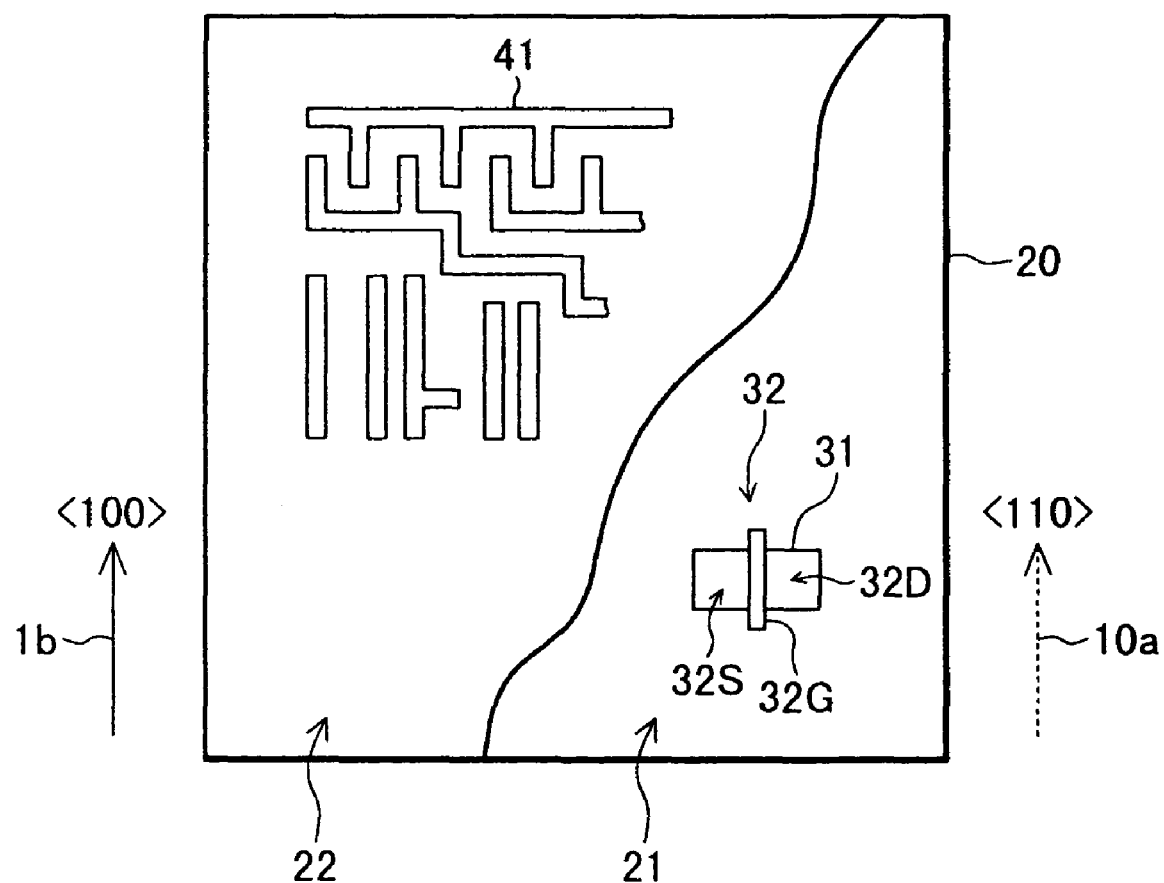
FIG. 4 is a schematic plan view showing a semiconductor chip according to the embodiment of the present invention.

FIG. 4 shows a schematic plan view of one chip. A lower right region 21 of the chip 20 showed in FIG. 4 indicates an example of a schematic pattern of the gate electrode layer, and an upper left region 22 indicates an example of a schematic pattern of an upper wiring layer. In addition, the ratio of the size of a pattern and chip size shown in FIG. 4 is different from the reality, and the pattern is expressed larger than a size with an actual pattern. An end surface of the chip is parallel to the <110> direction of the supporting substrate 10 (refer to FIG. 3B), i.e., the direction that is easy to be cleaved.

A MOSFET 32 is formed on the surface of the device formation layer 1A (refer to FIG. 3B). The MOSFET 32 is consisted of a gate electrode 32G crossing an active region 31 and a source region 32S and a drain region 32D which are configured on both side of the gate electrode 32G. The gate electrode 32G is extended to a direction parallel to <100> direction 1b of the device formation layer 1A. The moving direction of the career which moves in the channel region between the sauce region 32S and the drain region 32D and the <100> direction 1b shown in FIG. 4 cross at right angles. Since the crystallographic axis expressed with <100> includes all of the crystallographic axes that are equivalent to [100], the direction that intersects perpendicularly with <100> direction 1b is also expressed as <100>. That is, the moving direction of career is parallel to the <100> directions.

The career mobility can be increased by making the moving direction of career into the <100> direction. Thereby, the electrical property of the MOSFET can be increased.

As shown in an area 22 in FIG. 4, plurality of the wirings 41 is formed. Most of the wirings 41 are parallel to the <110> direction of the supporting substrate 10. Therefore, the cross section of the wirings 41 can easily be exposed and be inspected by cleaving the supporting substrate 10. Also, since a gate electrode 32G is parallel to the <110> direction of the supporting substrate10, the cross section of the gate electrode 32G can be observed and be performed defection analysis.

As shown in FIG. 4, however most of the wirings 41 are placed in parallel to the <110> direction of the supporting substrate 10, a part of the wirings 41 may be placed in slant to <110> direction of the supporting substrate 10. Generally, the wiring extended to the direction of slant is less than 10% of the full length of wiring in the wiring layer. It is effective when the wiring in the slant direction is less than 30% of the full length of wiring, that is, the full length of the wiring arranged at parallel to the <110> direction of the supporting substrate 10 is 70% or more of full length of all wiring in the wiring layer.

As explained with the above-described embodiment, by shifting the <110> direction of the device formation layer 1A from the <110> direction of the supporting substrate 10 at just 45 degree, a property of the MOSFET will be improved, and it can be easily split into chips by cleaving. In addition, it can be possible to have the same effect by making the angle of the <110> direction of the device formation layer 1A and the <110> direction of the supporting substrate 10 into 42 to 48 degrees.

In the above-described embodiment, although the supporting substrate 10 and the device formation layer 1A were formed of single crystalline silicon, they may be formed of single crystal semiconductors other than silicon. At that time, scribe lines are arranged to be parallel to the direction where the supporting substrate is easy to be cleaved. Moreover, the direction of the crystallographic axis of the device formation layer is adjusted so that the mobility in case the career moves in the direction parallel to the scribe lines may become high. Moreover, the great portion of the gate electrode and wirings are configured to be parallel to the scribe lines. With the above-described configuration, the same effect as the above-mentioned embodiment can be acquired.

The present invention has been described in connection with the preferred embodiments. The invention is not limited only to the above embodiments. It is apparent that various modifications, improvements, combinations, and the like can be made by those skilled in the art.

What is claimed is:

1. A method for manufacturing a semiconductor device, comprising the steps of:
    (a) forming a laminated substrate by laminating a device formation layer consisting of single crystalline semiconductor on a supporting substrate consisting of single crystalline semiconductor via an insulating layer wherein a direction of a crystallographic axis of the device formation layer is shifted from a corresponding crystallographic axis of the supporting substrate;
    (b) forming semiconductor devices on the device formation layer within a plurality of areas divided by scribe lines, the scribe lines being defined on the device formation layer and not on the supporting substrate, the scribe lines extending to a direction being parallel to a direction of a crystallographic axis of the supporting substrate where the supporting substrate is easy to be cleaved; and
    (c) splitting the laminated substrate into a plurality of chips by cleaving the supporting substrate along the scribe lines;
    wherein the step (b) further comprises the step of forming a wiring layer comprising wiring wherein at least 70% of a full length of all the wiring in the wiring layer extends to a direction being substantially parallel to a direction of a crystallographic axis of the supporting substrate where the supporting substrate is easy to be cleaved.

2. A method for manufacturing a semiconductor device according to claim 1, further comprising, between the step (b) and the step (c), the step of forming grooves reaching at least a bottom of the device formation layer from a surface of the device formation layer along the scribe lines.

3. A method for manufacturing a semiconductor device according to claim 1, wherein
    the supporting substrate and the device formation layer consist of single crystalline silicon,
    orientation of crystal plane of laminating surfaces of both supporting substrate and device formation layer is [100] plane, and
    a <110> direction of the device formation layer is shifted from a <110> direction of the supporting substrate just at an angle of 42 to 48 degree.

4. A method for manufacturing a semiconductor device according to claim 3, wherein the scribe lines are parallel to the <110> direction of the supporting substrate.

5. A method for manufacturing a semiconductor device according to claim 3, wherein the step (b) further comprises the step of forming an active device on the device formation layer, a moving direction of carrier of active device being the <100> direction of the device formation layer.

* * * * *